United States Patent [19]

Benoit-Gonin et al.

[11] Patent Number: 4,488,129

[45] Date of Patent: Dec. 11, 1984

[54] DEVICE FOR CURRENT-READING OF A QUANTITY OF ELECTRIC CHARGES AND A CHARGE-TRANSFER FILTER EQUIPPED WITH SAID DEVICE

[75] Inventors: Roger Benoit-Gonin; Jean L. Berger; Jean L. Coutures, all of Paris, France

[73] Assignee: Thomson-CSF, Paris, France

[21] Appl. No.: 419,207

[22] Filed: Sep. 17, 1982

[30] Foreign Application Priority Data

Sep. 25, 1981 [FR] France ............... 81 18135

[51] Int. Cl.³ ............ H03H 15/02; H03H 17/02; G11C 19/28
[52] U.S. Cl. ............ 333/165; 307/304; 333/166; 377/60; 377/63
[58] Field of Search ............ 333/165, 166; 328/151; 377/75–81, 57–63; 307/352–354, 358, 362, 363, 364, 246, 304

[56] References Cited

U.S. PATENT DOCUMENTS 3,623,132 11/1971 Green ................... 307/362
4,293,832 10/1981 Berger ................... 333/166 X
4,355,244 10/1982 Benoit-Gonin et al. ..... 307/304

FOREIGN PATENT DOCUMENTS 2389899 12/1978 France .
2430694 2/1980 France .

Primary Examiner—Marvin L. Nussbaum
Attorney, Agent, or Firm—Roland Plottel

[57] ABSTRACT

In a device for current-reading of a quantity of electric charges, the control circuit for the first and second MOS transistors receives a constant potential and comprises:

a third transistor, the drain and gate of which are connected to the constant potential and the source of which is connected to the drain and to the gate of the second transistor;

a second capacitor connected through one of its terminals to the nodal point of the second and the third transistor.

The device is employed for reading quantities of charges which arrive under the storage electrodes of charge-transfer filters.

14 Claims, 4 Drawing Figures

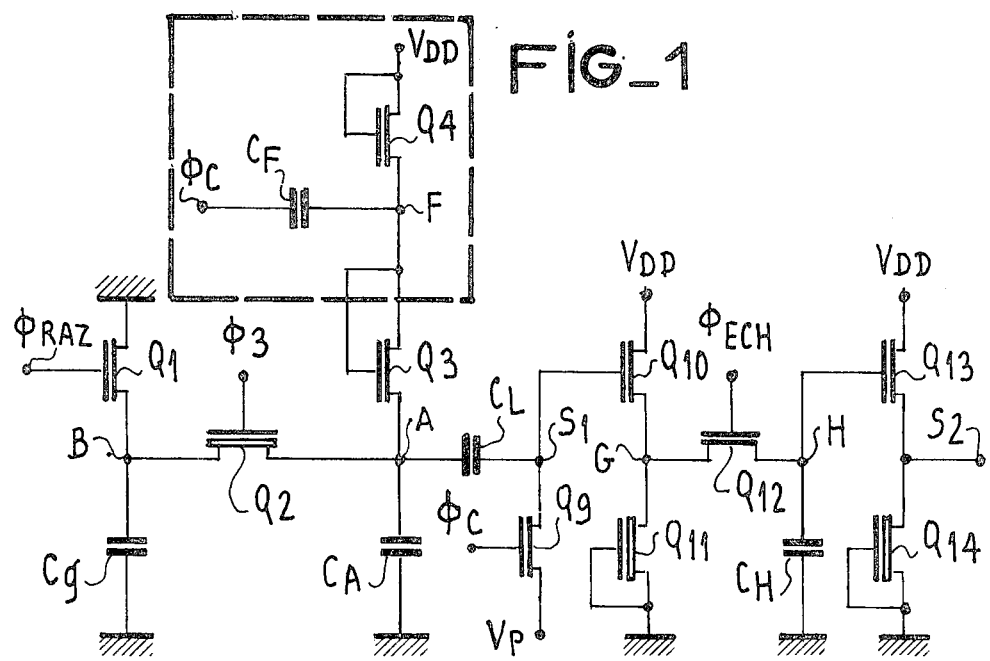
FIG_1
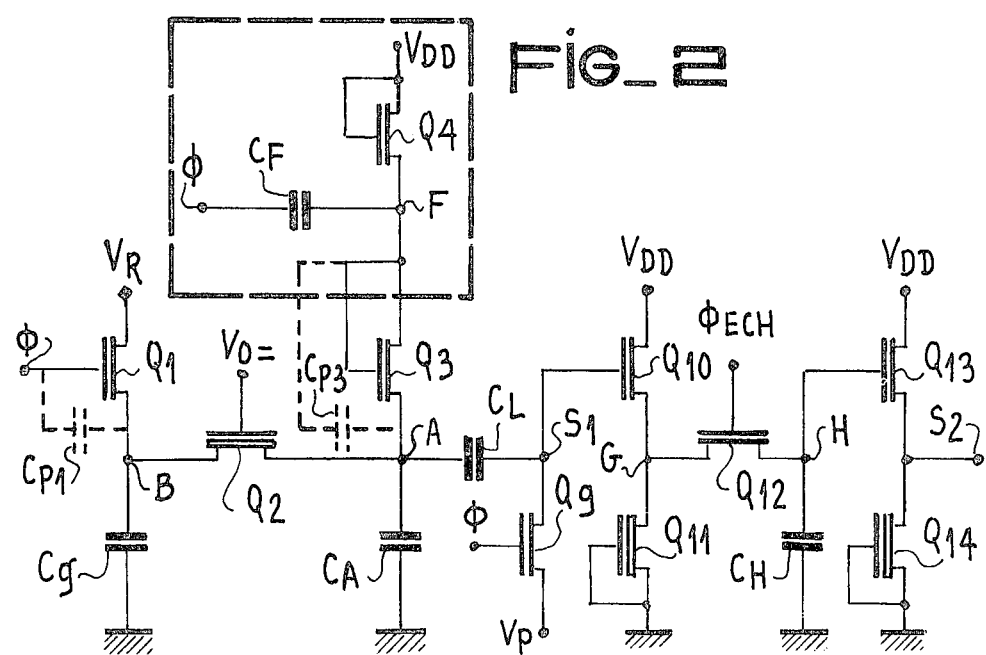
FIG_2

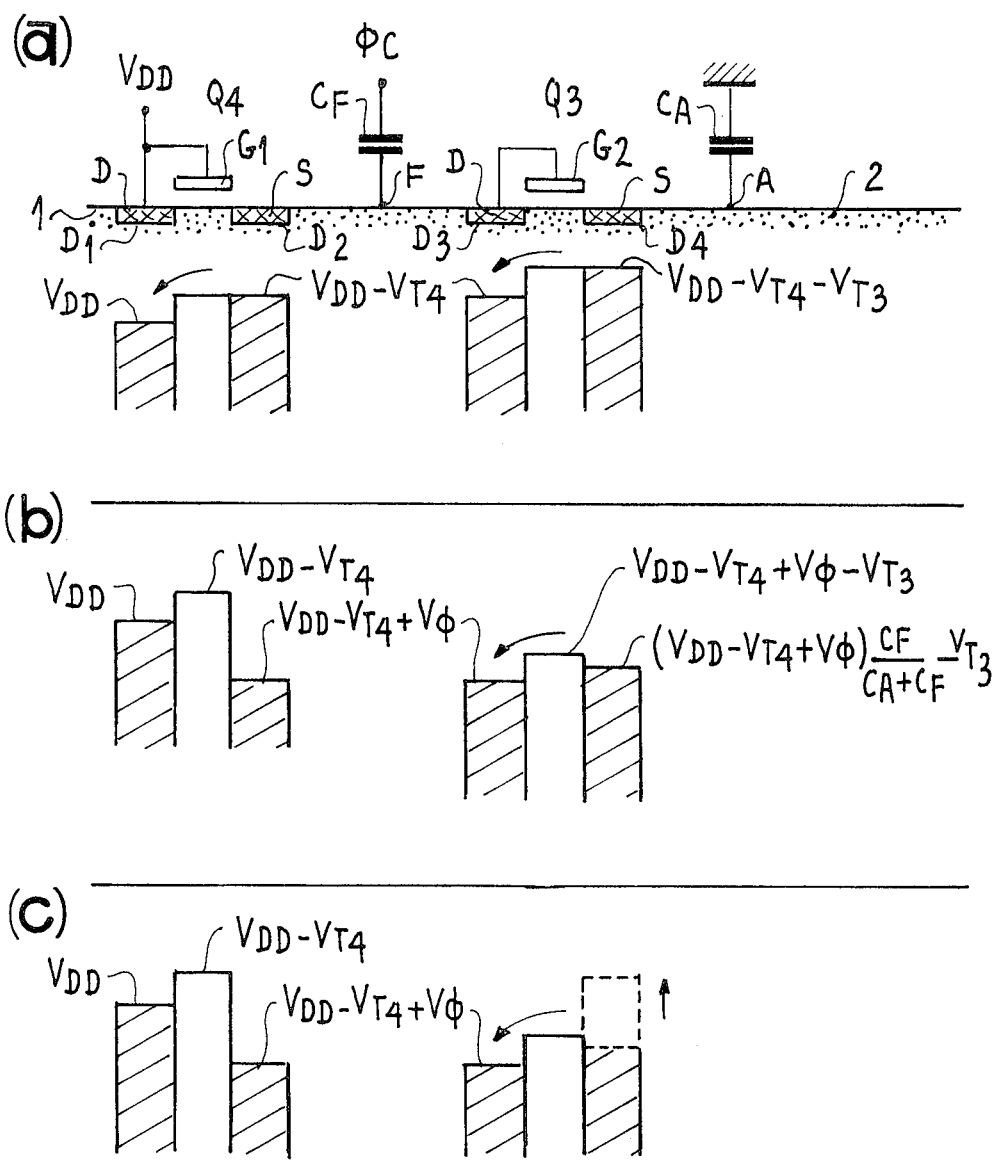

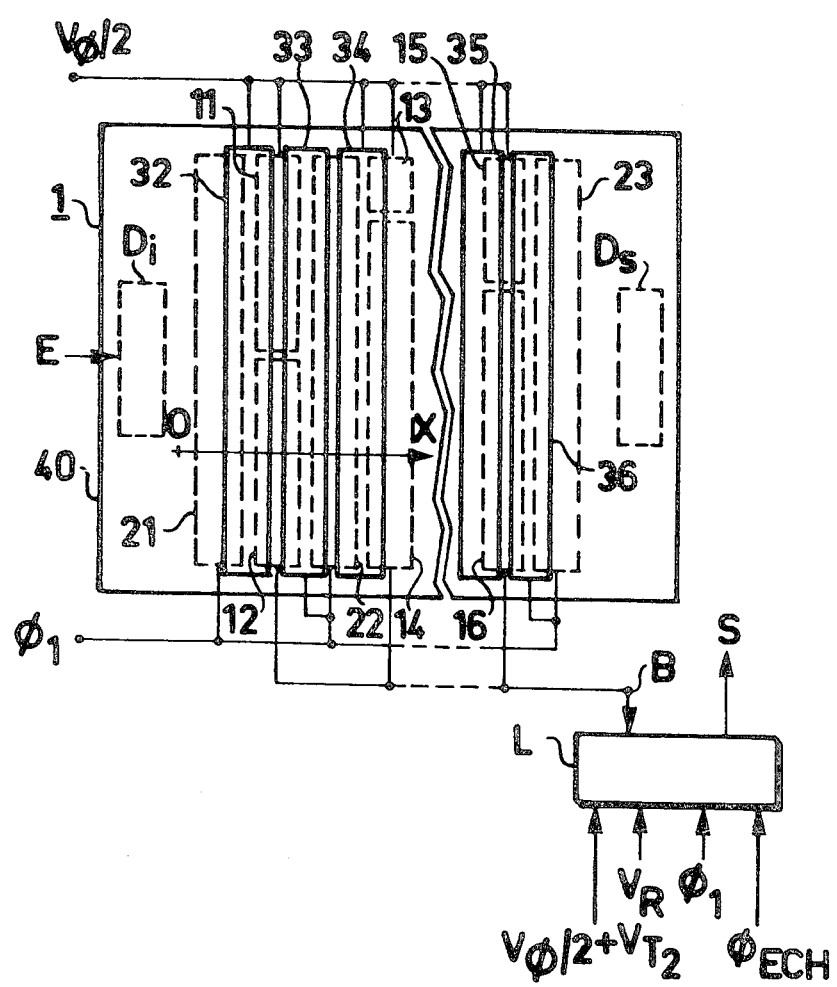
FIG_4

“DEVICE FOR CURRENT-READING OF A QUANTITY OF ELECTRIC CHARGES AND A CHARGE-TRANSFER FILTER EQUIPPED WITH SAID DEVICE”

This invention relates to a device for current-reading of a quantity of electric charges and is also applicable to a charge-transfer filter equipped with said device.

Devices of this type are already known and were described in particular to U.S. Pat. No. 4,355,244. The device according to the present invention is distinguished from the device described in the cited patent application by the structure of the control circuit of the transistors $Q_2$ and $Q_3$.

It is recalled that the design function of said control circuit is to charge the capacitor $C_A$, to maintain the transistor $Q_2$ in the saturating mode, and consequently to maintain a constant potential at the point B of arrival of charges, at the time of charge inflow. The effect of said charges inflow is thus to produce a variation in potential at the nodal point A of the transistors $Q_2$ and $Q_3$, which makes it possible to obtain the reading signal.

Whereas the control circuit of the patent application cited earlier is constituted by three MOS transistors $Q_4$, $Q_5$ and $Q_6$ and by two capacitors $C_E$ and $C_F$, the control circuit of the device according to the present invention consists only of a single transistor and a single capacitor.

The device according to the present invention therefore offers advantages in regard to simplicity of construction while also achieving a reduction in overall size.

This invention relates to a device for current-reading of a quantity of electric charges in which provision is made for a first MOS transistor $Q_2$ and a second MOS transistor $Q_3$, said transistors being connected in series to the point B of arrival of the quantity of charges. A first capacitor $C_A$ is connected through one of its terminals to the nodal point A of the two transistors. Said device further comprises a control circuit for the two transistors $Q_2$ and $Q_3$. According to the present invention, said control circuit receives a constant potential $V_{DD}$ and comprises:

a third MOS transistor $Q_4$ whose drain and gate are connected to the constant potential $V_{DD}$ and whose source is connected to the drain and to the gate of the second transistor $Q_3$;

a second capacitor $C_F$ which is connected via one of its terminals to the nodal point F of the second and third transistors $Q_3$ and $Q_4$.

Other features of the invention will be more apparent upon consideration of the following description and accompanying drawings, wherein:

FIGS. 1 and 2 are diagrams of the device according to the invention;

FIG. 3 parts (a), (b), and (c) are transverse sectional views of the MOS transistors $Q_3$ and $Q_4$ and diagrams which serve to explain the operation of said transistors.

FIG. 4 is a schematic plane view of a filter and device according to an aspect of the invention.

In the different figures, the same reference symbols designate the same elements but the dimensions and proportions of the various elements have not been observed in the drawings for the sake of enhanced clarity.

FIG. 1 illustrates a diagram of the device according to the invention for current-reading of a quantity of electric charges. This figure differs from FIG. 1 of the patent application cited earlier only in the structure of the control circuit of the MOS transistors $Q_2$ and $Q_3$. In FIG. 1, said control circuit is framed in dashed outline. The same reference symbols have been adopted in both figures. So far as concerns the description of FIG. 1 of the present patent application, reference will therefore be made to the description of FIG. 1 of the patent application cited earlier except in regard to the control circuit which will be described hereinafter.

It is recalled, however, that the reading device aforesaid comprises two MOS transistors $Q_2$ and $Q_3$ which are connected in series to the point B of arrival of the quantity of charges to be read.

One terminal of a capacitor $C_A$ is connected to the nodal point A of the two transistors. The other terminal of said capacitor $C_A$ is connected to ground. The MOS transistor $Q_2$ receives the quantity of charges to be measured via a capacitor $C_g$ which is connected between the point B and ground. There is also connected to the point B a MOS transistor $Q_1$ which serves to reset the device to zero. A capacitor $C_L$ is connected to the nodal point A of the first transistor and of the second transistor. The other terminal $S_1$ of said capacitor $C_L$ is connected to a transistor $Q_9$ which serves to carry out a pre-charge of the capacitor $C_L$ by means of a second constant potential $V_P$ having a value lower than or equal to the potential $V_{DD}$ which supplies the control circuit. Finally, the device comprises a circuit for sampling and maintaining the signal available at the point $S_1$ and delivering the output signal $S_2$ of the device.

The control circuit according to the present invention for the transistors $Q_2$ and $Q_3$ is constituted by an enhancement-mode MOS transistor $Q_4$, the drain and gate of which are connected to the constant potential $V_{DD}$. The source of the transistor $Q_4$ is connected to the drain and to the gate of the MOS transistor $Q_3$. One of the terminals of a capacitor $C_F$ is connected to the nodal point F of the MOS transistors $Q_3$ and $Q_4$. The clock signal $\phi_C$ which is illustrated in FIG. 2e of the patent application cited earlier is applied to the other terminal of the capacitor $C_F$. In the control circuit according to the present invention, the MOS transistor $Q_3$ is an enhancement-mode MOS transistor. In the patent application cited earlier, the MOS transistor $Q_3$ was a depletion-mode transistor. The type (namely depletion-mode or enhancement-mode) of the other MOS transistors of the device remains unchanged.

This description is given in the case of n-channel MOS transistors, the majority of which are of the enhancement-mode type and some of which are of the depletion-mode type, namely the transistors $Q_2$, $Q_{11}$ and $Q_{14}$. As can readily be understood, the device can be constituted by p-channel MOS transistors. Similarly, certain depletion-type MOS transistors can be replaced by enhancement-type MOS transistors, and conversely. However, the transistors $Q_3$ and $Q_4$ are of the enhancement-mode type and if enhancement mode MOS transistors are employed in the case of $Q_{11}$ and $Q_{14}$, the gates of said transistors must be connected to their drains and not connected to their sources as is the case in FIG. 1. It is also worthy of note that, in regard to the MOS transistor $Q_2$, it is preferable to make use of a depletion-type MOS transistor whose inherent noise is lower than that of an enhancement-type MOS transistor.

The operation of the control circuit of the MOS transistors $Q_2$ and $Q_3$ according to the present invention will now be considered.

In order to explain the operation of the circuit, reference will be made to FIGS. 3(a), 3(b) and 3(c) which provide a cross-sectional view of the MOS transistors Q₃ and Q₄ and diagrams representing the progressive variation in surface potential $\phi_S$ in the semiconductor substrate 2. The hatched zones indicate the presence of minority carriers. In FIG. 3(a), there are shown from left to right:

the MOS transistor $Q_4$ constituted by two diodes $D_1$ and $D_2$ and by a gate $G_1$. The diode $D_1$ and the gate $G_1$ are connected to the constant potential $V_{DD}$;

the capacitor $C_F$ which receives the clock signal $\phi_C$ and which is connected to the point F. This capacitor is not usually integrated on the semiconductor wafer by reason of its high value;

the MOS transistor $Q_3$ which is constituted by two diodes $D_3$ and $D_4$ and by a gate $G_2$. The diode $D_3$ and the gate $G_2$ are connected together;

the capacitor $C_A$ which is usually integrated on the semiconductor wafer 2 and which is represented schematically in FIG. 3(a), said capacitor being connected between the point A and ground.

FIG. 3(a) shows the progressive variation in surface potentials and in the initial state, that is to say when the clock signal $\phi_C$ is still located at the low level and has never been at the high level.

The transistors $Q_3$ and $Q_4$ are connected together in such a manner as to be in the saturating mode.

The potential on the diode $D_1$ is fixed at $V_{DD}$. Beneath the gate $G_1$, the potential is fixed at $V_{DD}-V_{T4}$ where $V_{T4}$ represents the threshold voltage of the transistor $Q_4$. The diode $D_2$ and the diode $D_3$ are aligned with the potential $V_{DD}-V_{T4}$. There is therefore present beneath the gate $G_2$ of the transistor $Q_3$ a potential equal to $V_{DD}-V_{T4}-V_{T3}$, where $V_{T3}$ represents the threshold voltage of the transistor $Q_3$. The diode $D_4$ of the transistor $Q_3$ is also aligned with said potential.

The capacitor $C_F$ connected to the point F is charged through the transistor $Q_4$ substantially at constant current and at the potential $V_{DD}-V_{T4}$. During the same time interval, the capacitor $C_A$ is charged through the MOS transistor $Q_3$ substantially at constant current and at the potential $V_{DD}-V_{T4}-V_{T3}$.

FIG. 3(b) shows the progressive variation in surface potentials when the clock signal $\phi_C$ undergoes a transition to the high level. When the clock signals of the device change from the low level to the high level, they increase from a zero voltage to a voltage equal to $V_\phi$. When the control signal $\phi_C$ undergoes a change to the high level, the potential on the diodes $D_2$ and $D_3$ changes to: $V_{DD}-V_{T4}+V_\phi$. The MOS transistor $Q_4$ is therefore turned-off. Beneath the gate $G_2$ and the diode $D_4$, the potential is established at: $V_{DD}-V_{T4}+V_\phi-V_{T3}$. The capacitor $C_A$ is charged through the transistor $Q_3$ which is always in the saturating mode at a potential which is written:

$$(V_{DD} - V_{T4} + V_\phi) \cdot \frac{C_F}{C_A + C_F} - V_{T3}$$

The same potential is again found on the diode $D_4$ which is connected to the point A.

This voltage is the pre-charge voltage of the point A which serves to drive the transistor $Q_2$ into saturation before the charges arrive at the point B at the instant $t_3$ shown in FIG. 2a of the document cited earlier and represented as the instant at which the clock signal $\phi_1$ returns to zero, said signal being applied to the charge-transfer filter on which the charges are to be read.

The capacitor $C_F$ is capable of receiving the clock signal $\phi_C$ as shown in FIG. 1. The clock signal $\phi_{RAZ}$ can also be employed as shown in FIG. 2c of the patent application cited earlier. It is also possible to employ any other clock signal which is at the high level during the time interval $T_O$ indicated in FIG. 2a of the patent application cited in the foregoing.

FIG. 3c shows the progressive variation in surface potentials within the substrate when the clock signal $\phi_C$ undergoes a transition to the low level. At the instant $t_3$, a quantity of charges $Q_s$ arrives at the point B, thus resulting in a reduction in potential at said point B. Said quantity of charges $Q_s$ is transmitted to the point A and the capacitor $C_A$ is discharged by a quantity of charges equal to the quantity of charges $Q_s$. The potential at A is reduced. The potential on the diode $D_4$ decreases and is then aligned with the potential which is present beneath the gate $G_2$.

The value chosen for the capacitor $C_F$ is sufficiently high to ensure that said capacitor practically does not discharge when the clock signal $\phi_C$ is located at the low level.

When the clock signal $\phi_C$ undergoes a further transition to the high level, the charges of the capacitors $C_A$ and $C_F$ are again fixed in an accurate manner. The potentials of FIG. 3b are again present.

In practice, the capacitor $C_F$ has a value between thirty and one hundred times higher than that of the capacitor $C_A$. Typical values of the voltages $V_{DD}$, $V_\phi$, $V_{T3}$ and $V_{T4}$ are:

$V_{DD} = 12$ V
$V_\phi = 17$ V
$V_{T3} = V_{T4} = 3$ V

If the value $C_F/C_A = 100$ is chosen, the pre-charge voltage $V_A$ of the point A is calculated so as to be equal to 22.7 V. In actual fact, the measured voltage $V_A$ is only 18 V by reason of the stray capacitances of the circuit.

It is observed that the pre-charge voltage $V_A$ of the point A is of the order of twenty volts whereas the operation of the device requires only a direct-current voltage which does not exceed $V_{DD}$ and which is of the order of twelve volts.

The value of the capacitor $C_F$ is dependent on the value of the capacitor $C_A$. If the following value of $C_A$ is chosen: $C_A = 10$ pF, the capacitor $C_F$ then has a capacitance of 300 to 1000 pF and will be external to the substrate. As a general rule, the capacitor $C_A$ will be integrated on the semiconductor wafer. In practice, it is possible to integrate capacitances up to 30 pF without giving rise to any problem, especially in regard to overall size.

FIG. 2 represents a diagram of the device according to the invention in which a few modifications have been made with respect to the diagram of FIG. 1.

It is noted that the transistor $Q_2$ receives a direct-current voltage $V_O$ on its gate. The transistors $Q_1$ and $Q_9$ and the capacitor $C_F$ receive the same clock signal $\phi$. There are also shown in FIG. 2 the stray capacitances $C_{p1}$ and $C_{p3}$ which exist on the transistors $Q_1$ and $Q_3$.

In order to simplify the clock circuits and to facilitate generation of the clock signals in the event of operation at higher frequency, the charge-transfer filter on which the device according to the invention makes it possible to carry out readings of quantities of charges is capable of operating in single phase or in other words with a single clock signal. Charge-transfer filters are described in the patent application cited earlier. A charge-transfer filter used with the device of the present invention is shown on FIG. 4.

It is recalled that the charge-transfer filters associated with the reading devices according to the invention comprise a semiconductor substrate 1 covered with an insulating layer (not shown) on which charge-storage electrodes 11 to 16 and 21 to 23 are deposited. Charge-transfer electrodes 32 to 36 are deposited between the storage electrodes and isolated from these latter by means of an additional insulating layer. Each transfer electrode is connected to the adjacent storage electrode. At both ends of the device, there is formed in the substrate 1 a diode designated respectively as $D_i$ and $D_S$ having the design function in the case of the first diode ($D_i$) of injecting into the substrate 1 a quantity of charges representing an input signal E in accordance with one of the known techniques and in the case of the second diode ($D_s$) of collecting the charges in order to remove them.

The electric charges are transferred from $D_i$ to $D_s$ in a direction Ox by means of the above-mentioned electrodes which are placed at right angles to Ox and constitute the elements of a shift register.

One storage electrode out of two (the electrodes 11-12, 13-14 and 15-16 in the figure) is cut into two or more portions and reading usually takes place only beneath one portion of each cut storage electrode.

When the filter operates in single phase, it does not receive the clock signals $\phi_1$ and $\phi_2$ which are shown in FIGS. 2a and 2b of the patent application cited earlier.

Said filter then receives only one clock signal $\phi_1$, for example, and this latter is applied to the oddnumbered storage electrodes 21 to 23, for example.

The even-numbered storage electrodes 11 to 16 then receive a direct-current voltage which is close in value to $V_\phi/2$ and reading is performed under (these) the electrodes 12, 14, 16 which are connected to the available signal at point B.

It is known that, under operating conditions, a well defined quantity of charges corresponding to the input signal E is transferred successively under each electrode as a result of application of the signal $\phi_1$ and $V_\phi/2$ to said electrodes. As they pass under each divided electrode (12,14 and 16), the charges are read by means of a device designated by the reference L.

The device L is similar to device shown on FIG. 2 of the present application.

The gate of the transistor $Q_2$ receiving the voltage $V_0$ which is close in value to $V_\phi/2$ when the quantity of charges $Q_s$ to be read arrives at the point B, the transistor $Q_2$ is then in the saturating mode and the voltage at the point B is equal to $V_\phi - V_{T2}$. The even-numbered storage electrodes 11 to 16 under which the reading takes place are usually cut into two or more portions. Reading of charges is usually performed only one portion 12, 14, 16 of each storage electrode. The non-useful portions 11, 13, and 15 of the storage electrodes are connected to the direct-current voltage $V_\phi/2$. At the time of reading, it is accordingly preferrable to apply the same voltage under the useful portions of the storage electrodes which are connected to the point B.

In consequence, the potential $V_O$ is therefore chosen so that:

$$V_0 - V_{T2} = V_\phi/2, \text{ whence } V_0 = V_\phi/2 + V_{T2}$$

In the case of FIG. 1, the capacitor $C_F$ and the transistor $Q_9$ receive the clock signal $\phi_C$ and the transistor $Q_1$ receives the clock signal $\phi_{RAZ}$. The same clock signal $\phi$ cam be applied to the capacitor $C_F$ and to the transistors $Q_1$ and $Q_9$. Said clock signal can be one of the signals $\phi_C$ or $\phi_{RAZ}$, or else an intermediate signal which is at the high level during the time interval $T_2$ which is indicated in FIG. 2 of the patent application cited earlier. In the case of FIG. 2, the filter with which the reading device is associated operates in single phase and the clock signal $\phi$ employed can consist of the clock signal $\phi_1$.

It is then necessary to ensure that the transistor $Q_1$ in fact reverts to the non-conducting state before the quantity of charges to be read arrives at the point B.

It is in fact noted in FIG. 2 that the transistor $Q_1$ is no longer connected to ground but to an adjustable direct-current voltage $V_R$. By reason of the threshold voltage of the transistor $Q_1$ and the bias voltage $V_R$ which is usually chosen, the transistor $Q_1$ is turned-off when $\phi_1$ arrives at $V_\phi/2$ whereas the charges have not yet been transferred under the storage electrodes connected to the point B.

When the clock signal $\phi_1$ is applied to the capacitor $C_F$ and to the transistors $Q_1$ and $Q_9$, two clock signals $\phi_1$ and $\phi_{ECH}$ are sufficient to ensure single-phase operation of the filter and of its reading device.

Stray couplings play an important part in establishing the potentials at the points A and B at the moment of reading. The stray capacitance $C_{P3}$ between the assembly consisting of drain plus gate and the source of the transistor $Q_3$ and the stray capacitance $C_{P1}$ between the gate and the drain of the transistor $Q_1$ are represented schematically in dashed lines in FIG. 2. It is also necessary to take into account the overlap capacitance $C_r$ between the transfer and storage electrodes of the filter to which the reading device is connected. As a result of these stray capacitances, the total variation of the potentials at the point A at the time of arrival of a quantity of charges $Q_S$ at the point B is written:

$$\frac{Q_S}{C_A} + \frac{C_{p3}}{C_A} \cdot V_\phi + \frac{C_{p1} + C_r}{C_A} \cdot V_\phi - [V_R - (V_0 + V_{T2})] \cdot \frac{C_g}{C_A}$$

The last term shows that it is possible by adjusting the variable direct-current voltage $V_R$ to correct the error introduced by the stray capacitances $C_{P1}$, $C_{P3}$ and $C_r$.

As will readily be apparent, it is possible to associate the device according to the invention with charge-transfer filters of slightly different structure in which in particular reading of charges takes place beneath two portions of each cut storage electrode.

What is claimed is:

1. A device for current-reading of a quantity of electric charges, comprising a first MOS transistor and a second MOS transistor connected in series to the point of arrival of the quantity of charges, a first capacitor connected through one of its terminals to the nodal point of the two transistors and a control circuit for said two transistors, the function of said control circuit being to charge the first capacitor and to maintain the first transistor in the saturating mode at the time of inflow of the charges, the effect of said inflow being to produce a variation in potential at the nodal point which delivers the reading signal, wherein said control circuit receives a constant potential and comprises:

a third MOS transistor whose drain and gate are connected to the constant potential and whose source is connected to the drain and to the gate of the second transistor;

a second capacitor connected through one of its terminal to the nodal point of the second transistor and third transistor.

2. A device according to claim 1, wherein a third charge-storage capacitor is connected to the point of arrival.

3. A device according to claim 1 or claim 2, wherein said device comprises a fourth transistor for resetting the device to zero.

4. A device according to claim 1, wherein said device comprises a further capacitor connected to the nodal point of the first and second transistors, the other terminal of said further capacitor being connected to a further transistor which serves to pre-charge the further capacitor by means of a second constant potential which is lower than or equal to the first constant potential.

5. A device according to claim 4, wherein said device comprises a circuit for sampling and maintaining the available signal at the nodal point of the further capacitor and the further transistor and for delivering the output signal of the device.

6. A device according to claim 1, wherein the second and third transistors are enhancement-mode transistors.

7. A device according to claim 1, wherein the first transistor is a depletion-mode transistor.

8. A device according to claim 4 or 5, wherein the further transistor and the further transistor are enhancement-mode transistors.

9. A device according to claim 1, wherein the MOS transistors are of the n-channel type.

10. A charge-transfer filter comprising a semi-conductor substrate covered with an insulating layer on which charge-tranfer electrodes and charge-storage electrodes are arranged in alternate sequence and serve to transfer charges into the substrate upon application of given potentials, wherein said filter comprises a device for current reading of a quantity of electric charges beneath the storage electrodes which are cut into two or more portions; said device comprising a first MOS transistor and a second MOS transistor connected in series to the point of arrival of the quantity of charges, a first capacitor connected through one of its terminals to the nodal point of the two transistors and a control circuit being to charge the first capacitor and to maintain the first transistor in the staturating mode at the time of inflow of the charges, the effect of said inflow being to produce a variation in potential at the nodal point which delivers the reading signal, wherein said control circuit receives a constant potential and comprises;

a third MOS transistor whose drain and gate are connected to the constant potential and whose source is connected to the drain and to the gate of the second transistor;

a second capacitor connected through one of its terminal to the nodal point of the second transistor and third transistor.

11. A filter according to claim 10, wherein said filter is designed for single-phase operation, a clock signal being applied to one storage electrode out of two whereas the other storage electrodes are cut into two or more portions, reading of charges being carried out beneath at least one portion of each of said storage electrodes in which the non-useful portions receive a constant voltage, and wherein the first transistor receives on its gate a constant voltage such that the potential of the charge-arrival point to which the useful portions of the storage electrodes are connected is equal at the time of inflow of charges to the voltage applied to the non-useful portions of the storage electrodes.

12. A filter according to claim 10 or claim 11 wherein the device for current reading of a quantity of electric charges comprises a fourth transistor for resetting the device to zero and a fifth transistor to precharge a further capacitor, wherein the second capacitor, the fourth transistor and the fifth transistor receive the same clock signal.

13. A filter according to claim 12, wherein the clock signal is the same as the clock signal applied to one storage electrode out of two.

14. A filter according to claim 10, wherein the device for current reading of a quantity of electric charges comprises a fourth transistor for resetting the device to zero, wherein one of the terminals of the fourth transistor receives a direct-current voltage which is adjusted so as to compensate for the parasite charges transferred to the nodal point of the first and second transistors at the same time as the quantity of charges to be read.

* * * * *